(12) United States Patent
Aksu et al.

(10) Patent No.: US 12,425,042 B2
(45) Date of Patent: Sep. 23, 2025

(54) METHOD, AN APPARATUS AND A COMPUTER PROGRAM PRODUCT FOR NEURAL NETWORK COMPRESSION

(71) Applicant: Nokia Technologies Oy, Espoo (FI)

(72) Inventors: Emre Baris Aksu, Tampere (FI); Miska Matias Hannuksela, Tampere (FI); Hamed Rezazadegan Tavakoli, Espoo (FI); Francesco Cricrì, Tampere (FI)

(73) Assignee: Nokia Technologies Oy, Espoo (FI)

( * ) Notice: Subject to any disclaimer, the term of this patent is extended or adjusted under 35 U.S.C. 154(b) by 164 days.

(21) Appl. No.: 18/553,415

(22) PCT Filed: Apr. 4, 2022

(86) PCT No.: PCT/FI2022/050215
§ 371 (c)(1),
(2) Date: Sep. 29, 2023

(87) PCT Pub. No.: WO2022/219233
PCT Pub. Date: Oct. 20, 2022

(65) Prior Publication Data
US 2024/0195433 A1    Jun. 13, 2024

(30) Foreign Application Priority Data
Apr. 12, 2021    (FI) ..................... 20215428

(51) Int. Cl.
*H03M 7/30*  (2006.01)
*G06F 12/00*  (2006.01)
(Continued)

(52) U.S. Cl.
CPC ............ *H03M 7/30* (2013.01); *G06F 12/00* (2013.01); *G06F 12/02* (2013.01); *G06F 17/16* (2013.01); *G06N 20/00* (2019.01)

(58) Field of Classification Search
CPC ......... H03M 7/30; G06F 17/16; G06F 12/00; G06F 12/02; G06N 20/00
See application file for complete search history.

(56) References Cited

U.S. PATENT DOCUMENTS 11,940,907 B2 *   3/2024   Grymel ............... H03M 7/6017

FOREIGN PATENT DOCUMENTS

WO    2020/190772 A1    9/2020

OTHER PUBLICATIONS

"Potential improvements of Compression of Neural Networks for Multimedia Content Description and Analysis", WG 04, SO/IEC JTC 1/SC 29/WG 04, N0061, Jan. 2021, 85 pages.
(Continued)

*Primary Examiner* — Joseph J Lauture
(74) *Attorney, Agent, or Firm* — Nokia Technologies Oy

(57) ABSTRACT

The embodiments relate to a method for encoding two or more tensors. The method comprises processing the two or more tensors having respective dimensions so that the dimensions of said two or more sensors have the same number (510); identifying which axis of each individual tensor is swappable to result in concatenable tensors around an axis of concatenation (520); reshaping the tensors so that the dimensions are modified based on the swapped axis (530); concatenating the tensors around the axis of concatenation to result in concatenated tensor (540); compressing the concatenated tensor (550); generating syntax structures for carrying concatenation and axis swapping information (560); and generating a bitstream by combining the syntax structures and the compressed concatenated tensor (570). The embodiments also relate to a method for decoding, and to apparatuses for implementing the methods.

20 Claims, 5 Drawing Sheets

(51) Int. Cl.
*G06F 12/02* (2006.01)
*G06F 17/16* (2006.01)
*G06N 20/00* (2019.01)

(56) References Cited

OTHER PUBLICATIONS

Office action received for corresponding Finnish Patent Application No. 20215428, dated Sep. 9, 2021, 11 pages.
"[NNR] On combined compression of multiple tensors", ISO/IEC JTC 1/SC 29/WG 4, m55998, v5, Jan. 2021, pp. 1-4.
"Permute array dimensions", MathWorks, Retrieved on Oct. 27, 2023, Webpage available at : https://www.mathworks.com/help/matlab/ref/permute.html?s_tid=doc_ta.
"[NNR] On axis swapping for concatenated tensors", ISO/IEC JTC 1/SC 29/WG 4, m 56610, Apr. 2021, pp. 1-4.
International Search Report and Written Opinion received for corresponding Patent Cooperation Treaty Application No. PCT/FI2022/050215, dated Sep. 27, 2022, 18 pages.
"NumPy Reference", NumPy community, Release 1.20.0, Jan. 31, 2021, 1865 pages.
"Neural Network Exchange Format", The Khronos NNEF Working Group, Version 1.0.3, Revision 2, Aug. 27, 2020, 87 pages.
"SciPy Reference Guide", SciPy community, Release 1.7.0, Jun. 21, 2021, 3301 pages.
Extended European Search Report received for corresponding European Patent Application No. 22787686.9, dated Mar. 3, 2025, 14 pages.
Office action received for corresponding Indian Patent Application No. 202347067603, dated Apr. 4, 2025, 8 pages.
Kazemi et al., "A High Video Quality Multiple Description Coding Scheme For Lossy Channels", IEEE International Conference on Multimedia and Expo, Jul. 11-15, 2011, 6 pages.
Smith et al., "Internet Multimedia Management Systems III", SPIE, vol. 4862, Jul. 1, 2002, 11 pages.

* cited by examiner

Fig. 2

NNR Unit: [NNR Unit Size | NNR Unit Header | NNR Unit Payload]

Fig. 3

Aggregate NNR Unit: [NNR Unit Size | NNR Unit Header | NNR Unit Payload]

NNR Unit: [NNR Unit Size | NNR Unit Header | NNR Unit Payload] ... NNR Unit: [NNR Unit Size | NNR Unit Header | NNR Unit Payload]

Fig. 4

NNR Bitstream: [NNR Unit | NNR Unit | NNR Unit | ...]

METHOD, AN APPARATUS AND A COMPUTER PROGRAM PRODUCT FOR NEURAL NETWORK COMPRESSION

RELATED APPLICATION

This application claims priority to PCT Application No. PCT/FI2022/050215, filed on Apr. 4, 2022, which claims priority to FI application No. 20215428, filed on Apr. 12, 2021, each of which is incorporated herein by reference in its entirety.

TECHNICAL FIELD

The present solution generally relates to representations of compressed neural networks.

BACKGROUND

Artificial neural networks are used for a broad range of tasks in multimedia analysis and processing, media coding, data analytics and many other fields. Trained neural networks contain a large number of parameter and weights, resulting in a relatively large size. Therefore, the trained neural networks should be represented in a compressed form.

SUMMARY

The scope of protection sought for various example embodiments of the invention is set out by the independent claims. The example embodiments and features, if any, described in this specification that do not fall under the scope of the independent claims are to be interpreted as examples useful for understanding various example embodiments of the invention.

Various aspects include a method, an apparatus and a computer readable medium comprising a computer program stored therein, which are characterized by what is stated in the independent claims. Various embodiments are disclosed in the dependent claims.

According to a first aspect, there is provided a method for encoding two or more tensors comprising processing the two or more tensors having respective dimensions so that the dimensions of said two or more sensors have the same number; identifying which axis of each individual tensor is swappable to result in concatenable tensors around an axis of concatenation; reshaping the tensors so that the dimensions are modified based on the swapped axis; concatenating the tensors around the axis of concatenation to result in concatenated tensor; compressing the concatenated tensor; generating syntax structures for carrying concatenation and axis swapping information; and generating a bitstream by combining the syntax structures and the compressed concatenated tensor.

According to a second aspect, there is provided a method for decoding, comprising receiving a bitstream comprising a compressed tensor's bitstream; processing the bitstream and identifying from syntax structures that the bitstream contains a compressed concatenated tensor; identifying dimensions of individual tensors generating the concatenated tensor; identifying from a bitstream an axis swapping information indicating if axis swapping has been applied; decompressing the tensor into a decompressed tensor; splitting the decompressed tensor into individual tensors based on the identified dimension of the tensors; swapping axis of the individual tensors based on the axis swapping information; and decomposing the individual tensors so that their final dimensions match with the identified dimension of the individual tensors.

According to a third aspect, there is provided an apparatus comprising means for processing the two or more tensors having respective dimensions so that the dimensions of said two or more sensors have the same number; means for identifying which axis of each individual tensor is swappable to result in concatenable tensors around an axis of concatenation; means for reshaping the tensors so that the dimensions are modified based on the swapped axis; means for concatenating the tensors around the axis of concatenation to result in concatenated tensor; means for compressing the concatenated tensor; means for generating syntax structures for carrying concatenation and axis swapping information; and means for generating a bitstream by combining the syntax structures and the compressed concatenated tensor.

According to a fourth aspect, there is provided apparatus comprising means for receiving a bitstream comprising a compressed tensor's bitstream; means for processing the bitstream and identifying from syntax structures that the bitstream contains a compressed concatenated tensor; means for identifying dimensions of individual tensors generating the concatenated tensor; means for identifying from a bitstream an axis swapping information indicating if axis swapping has been applied; means for decompress the tensor into a decompressed tensor; means for splitting the decompressed tensor into individual tensors based on the identified dimension of the tensors; means for swapping axis of the individual tensors based on the axis swapping information; and means for decomposing the individual tensors so that their final dimensions match with the identified dimension of the individual tensors.

According to a fifth aspect, there is provided a computer program product comprising computer program code configured to, when executed on at least one processor, cause an apparatus or a system to process the two or more tensors having respective dimensions so that the dimensions of said two or more sensors have the same number; identify which axis of each individual tensor is swappable to result in concatenable tensors around an axis of concatenation; reshape the tensors so that the dimensions are modified based on the swapped axis; concatenate the tensors around the axis of concatenation to result in concatenated tensor; compress the concatenated tensor; generate syntax structures for carrying concatenation and axis swapping information; and generate a bitstream by combining the syntax structures and the compressed concatenated tensor.

According to a sixth aspect, there is provided a computer program product comprising computer program code configured to, when executed on at least one processor, cause an apparatus or a system to receive a bitstream comprising a compressed tensor's bitstream; process the bitstream and identifying from syntax structures that the bitstream contains a compressed concatenated tensor; identify dimensions of individual tensors generating the concatenated tensor; identify from a bitstream an axis swapping information indicating if axis swapping has been applied; decompress the tensor into a decompressed tensor; split the decompressed tensor into individual tensors based on the identified dimension of the tensors; swap axis of the individual tensors based on the axis swapping information; and decompose the individual tensors so that their final dimensions match with the identified dimension of the individual tensors.

According to an embodiment, the means for processing is configured to perform combining or flattening dimensions of a tensor so that said two or more tensors have the same number of dimensions.

According to an embodiment, bitstream is a compressed neural network bitstream

According to an embodiment, swapped dimension indexes are signaled in a syntax element present in a compressed data unit header.

According to an embodiment, dimension index swapping difference is signaled in a syntax element present in a compressed data unit header.

According to an embodiment, dimension index swapping difference comprises only non-zero indexes.

DESCRIPTION OF THE DRAWINGS

In the following, various embodiments will be described in more detail with reference to the appended drawings, in which

FIG. 2 shows an example of a NNR Unit data structure;

FIG. 3 shows an example of an aggregate NNR unit data structure;

FIG. 4 shows an example of NNR bitstream data structure;

DESCRIPTION OF EXAMPLE EMBODIMENTS

The following description and drawings are illustrative and are not to be construed as unnecessarily limiting. The specific details are provided for a thorough understanding of the disclosure. However, in certain instances, well-known or conventional details are not described in order to avoid obscuring the description. References to one or an embodiment in the present disclosure can be, but not necessarily are, reference to the same embodiment and such references mean at least one of the embodiments.

Reference in this specification to "one embodiment" or "an embodiment" means that a particular feature, structure, or characteristic described in connection with the embodiment is included in at least one embodiment of the disclosure MPEG is currently pursuing standardization of representations for compressed neural networks in the standardization group called NNR (Neural Network Representation). The standardization effort has reached the Draft International Standard (DIS) Stage (ISO/IEC DIS 15938-17).

Figure 1:
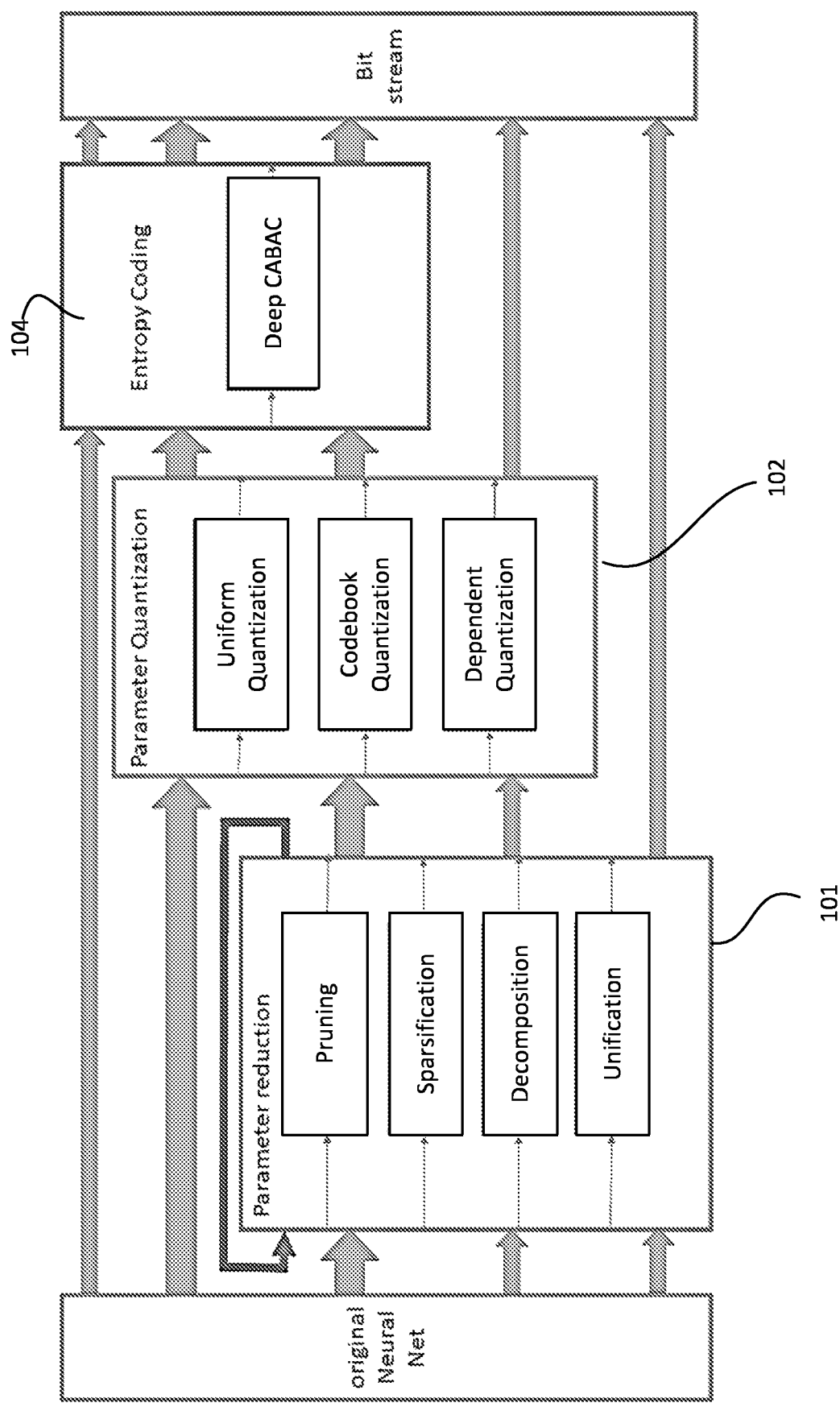
FIG. 1 shows an example of NNR encoding pipelines.

FIG. 1 illustrates an example of encoding pipelines that can be assembled using various compression tools. From the group of parameter transformation tools, multiple tools can be applied in sequence. Parameter quantization can be applied to source models as well as to the outputs of transformation with parameter reduction methods. Entropy coding may be applied to the output of quantization. Raw outputs of earlier steps without applying entropy coding can be serialized if needed.

FIG. 1 shows parameter reduction methods 101, comprising (parameter) pruning, (parameter) sparsification, decomposition and (weight) unification. In pruning, the number of parameters are reduced by eliminating parameter or group of parameters. The pruning results in a dense representation which has less parameters in comparison to the original model e.g. by removing some redundant convolution filters from the layers. In sparsification, parameters or group of parameters are processed to produce a sparse representation of a model, e.g. by replacing some weight values with zeros. In decomposition, a matrix decomposition operation is performed to change the structure of the weights of the model. In unification, parameters are processed to produces a group of similar parameters. Unification may not eliminate or constrain the weights to be zero. The entropy of model parameters are however lowered by making them similar to each other. The different parameter reduction methods 101 can be combined or applied in sequence to produce a compact model.

Parameter quantization methods 102 reduce the precision of the representation of parameters. If supported by the inference engine, the quantized representation can be used for more efficient inference. The parameter quantization methods may comprise a uniform quantization, a codebook quantization and dependent (scalar) quantization.

Entropy coding methods 104 are configured to encode the results of parameter quantization methods. An example of an entropy coding method is a Deep CABAC.

NNR High Level Syntax (HLS) allows concatenation of multiple tensors for efficient compression. Term "tensor" is a multidimensional structure that groups related model parameters. Concatenation of multiple tensors is signalled via topology_tensor_dimension_mapping( ) syntax element. In order to concatenate such tensors, all the other dimensions other than the concatenation axis index must be the same.

FIG. 2 illustrates an example of NNR Unit. NNR unit is a data structure for carrying neural network data and related metadata which is compressed or represented according to the standard. NNR units carry compressed or uncompressed information about neural network metadata, topology information, complete or partial layer data, filters, kernels, biases, quantized weights, tensors or alike. As shown in FIG. 2, an NNR unit comprises elements, such as NNR unit size, NNR unit header, and NNR unit payload. The NNR unit size signals the total byte size of the NNR Unit, including the NNR unit size. NNR unit header contains information about the NNR unit type and related metadata. NNR unit payload contains compressed and uncompressed data related to the neural network.

An aggregate NNR unit is an NNR unit which carries multiple NNR units in its payload. FIG. 3 shows an example of an aggregate NNR unit data structure. Aggregate NNR units provide a grouping mechanism for several NNR units which are related to each other and benefit from aggregation under a single NNR unit.

FIG. 4 shows an example of NNR bitstream data structure. NNR bitstream is composed of a sequence of NNR Units.

In an NNR bitstream, the following constraints apply unless otherwise stated in this document or defined by NNR profile:

An NNR bitstream shall start with an NNR start unit (NNR_STR);

There shall be a single NNR model parameter set (NNR_MPS) in and NNR bitstream which shall precede any NNR_NDU in the NNR bitstream;

NNR layer parameter sets (NNR_LPS) shall be active until the next NNR layer parameter set in the NNR bitstream or until the boundary of an Aggregate NNR unit is reached.

topology_elem_id values shall be unique in the NNR bitstream;

NNR_TPL or NNR_QNT units; if present in the NNR bitstream; shall precede any NNR_NDUs that reference their data structure (e.g. topolog_elem_id)

The unit types mentioned above, i.e. NNR_STR, NNR_MPS, NNR_NDU, NNR_LPS, NNR_TPL and NNR_QNT are NNR unit types as specified in the standard.

NNR bitstream has the following syntaxes:

NNR unit syntax:

| | Descriptor |
|---|---|
| nnr_unit( numBytesInNNRUnit ) {<br>  nnr_unit_size( )<br>  nnr_unit_header( )<br>  nnr_unit_payload( )<br>} | |

NNR unit size syntax:

| | Descriptor |
|---|---|
| nnr_unit_size( ) {<br>  nnr_unit_size_flag<br>  nnr_unit_size<br>} | u(1)<br>u(15 + nnr_unit_size_flag*16) |

NNR unit header syntax:

| | Descriptor |
|---|---|
| nnr_unit_header( ) {<br>  nnr_unit_type<br>  independently_decodable_flag<br>  partial_data_counter_present_flag<br>  if( partial_data_counter_present_flag )<br>    partial_data_counter<br>  if( nnr_unit_type == NNR_MPS )<br>    nnr_model_parameter_set_unit_header( )<br>  if( nnr_unit_type == NNR_LPS )<br>    nnr_layer_parameter_set_unit_header( )<br>  if( nnr_unit_type == NNR_TPL )<br>    nnr_topology_unit_header( )<br>  if( nnr_unit_type == NNR_QNT )<br>    nnr_quantization_unit_header( )<br>  if( nnr_unit_type == NNR_NDU )<br>    nnr_compressed_data_unit_header( )<br>  if( nnr_unit_type == NNR_STR )<br>    nnr_start_unit_header( )<br>  if( nnr_unit_type == NNR_AGG )<br>    nnr_aggregate_unit_header( )<br>} | u(6)<br>u(1)<br>u(1)<br><br>u(8) |

NNR start unit header syntax:

| | Descriptor |
|---|---|
| nnr_start_unit_header( ) {<br>  general_profile_idc<br>} | u(8) |

NNR model parameter set unit header syntax:

| | Descriptor |
|---|---|
| nnr_model_parameter_set_header( ) {<br>} | |

NNR layer parameter set unit header syntax:

| | Descriptor |
|---|---|
| nnr_model_parameter_set_header( ) {<br>} | |

NNR layer parameter set unit header syntax:

| | Descriptor |
|---|---|
| nnr_layer_parameter_set_header( ) {<br>  lps_self_contained_flag<br>  nnr_reserved_zero_7_bits<br>} | u(1)<br>u(7) |

NNR topology unit header syntax:

| | Descriptor |
|---|---|
| nnr_topology_unit_header( ) {<br>  topology_storage_format<br>  compressed_topology_flag<br>  if(compressed_topology_flag)<br>    topology_compression_format<br>  else<br>    byte_alignment( )<br>} | u(8)<br>u(1)<br><br>u(7) |

NNR quantization unit header syntax:

| | Descriptor |
|---|---|
| nnr_quantization_unit_header( ) {<br>  quantization_storage_format<br>  quantization_compressed_flag<br>  if(quantization_compressed_flag)<br>    quantization_compression_format<br>  else<br>    byte_alignment( )<br>} | u(8)<br>u(1)<br><br>u(7) |

NNR compressed data unit header syntax:

| | Descriptor |
|---|---|
| nnr_compressed_data_unit_header( ) {<br>  nnr_compressed_data_unit_payload_type<br>  nnr_multiple_topology_elements_present_flag<br>  nnr_decompressed_data_format_present_flag<br>  input_parameters_present_flag<br>  if(nnr_multiple_topology_elements_present_flag == 1)<br>    topology_elements_ids_list( )<br>  else<br>    topology_elem_id<br>  if( nnr_compressed_data_unit_payload_type ==<br>NNR_PT_FLOAT ||<br>    nnr_compressed_data_unit_payload_type<br>NNR_PT_BLOCK) {<br>    codebook_present_flag<br>    if( codebook_present_flag )<br>      integer_codebook( CbZeroOffset, Codebook )<br>  }<br>  if( nnr_compressed_data_unit_payload_type = =<br>NNR_PT_INT ||<br>    nnr_compressed_data_unit_payload_type =<br>NNR_PT_FLOAT ||<br>    nnr_compressed_data_unit_payload_type<br>NNR_PT_BLOCK)<br>    dq_flag<br>  if(nnr_decompressed_data_format_present_flag == 1)<br>    nnr_decompressed_data_format<br>  if(input_parameters_present_flag == 1) {<br>    tensor_dimensions_flag<br>    cabac_unary_length_flag<br>    compressed_parameter_types<br>    if((compressed_parameter_types &<br>NNR_CPT_DC) != 0){<br>      decomposition_rank<br>      g_number_of_rows<br>    }<br>    if(tensor_dimensions_flag == 1)<br>      tensor_dimension_list( )<br>    if(nnr_multiple_topology_elements_present_flag == 1) | u(5)<br>u(1)<br>u(1)<br>u(1)<br><br><br><br>st(v)<br><br><br><br><br>u(1)<br><br><br><br><br><br><br><br>u(1)<br><br>u(7)<br><br>u(1)<br>u(1)<br>u(4)<br><br><br>ue(3)<br>ue(3) |

| | Descriptor |
|---|---|
| topology_tensor_dimension_mapping( ) | |
|   if(cabac_unary_length_flag == 1) | |
|     cabac_unary_length | u(8) |
|   } | |
|   if( nnr_compressed_data_unit_payload_type == NNR_PT_BLOCK && | |
|     (compressed_parameter_types & NNR_CPT_DC) != 0 && | |
|     codebook_present_flag ) | |
|     integer_codebook( CbZeroOffsetDC, CodebookDC ) | |
|   if( count_tensor_dimensions > 1 ) { | |
|     scan_order | u(4) |
|     if( scan_order > 0 ) { | |
|       for( j=0; j < NumBlockRowsMinus1; j++ ) { | |
|         cabac_offset_list[j] | u(8) |
|         if( dq_flag ) | |
|           dq_state_list[j] | u(3) |
|         if( j == 0 ) { | |
|           bit_offset_delta1 | ue(11) |
|           BitOffsetList[j] = bit_offset_delta1 | |
|         } else { | |
|           bit_offset_delta2 | ie(7) |
|           BitOffsetList[j] BitOffsetList[j-1] + bit_offset_delta2 | |
|         } | |
|       } | |
|     } | |
|   } | |
|   byte_alignment( ) | |
| } | | integer_codebook( ) is defined as follows:

| | Descriptor |
|---|---|
| integer_codebook( cbZeroOffset, integerCodebook ) { | |
|   codebook_egk | u(4) |
|   codebook_size | ue(2) |
|   codebook_centre_offset | ie(2) |
|   cbZeroOffset = (codebook_size >> 1 ) + codebook_centre_offset | |
|   codebook_zero_value | ie(7) |
|   integerCodebook[cbZeroOffset] = codebook_zero_value | |
|   previousValue = integerCodebook[cbZeroOffset] | |
|   for( j = cbZeroOffset − 1; j >= 0; j−− ) { | |
|     codebook_delta_left | ue(codebook_egk) |
|     integerCodebook[j] = previous Value − codebook_delta_left − 1 | |
|     previousValue = integerCodebook[j] | |
|   } | |
|   previousValue = integerCodebook[cbZeroOffset] | |
|   for( j = cbZeroOffset + 1; j < codebook_size; j++ ) { | |
|     codebook_delta_right | ue(codebook_egk) |
|     integerCodebook[j] = previousValue + codebook_delta_right + 1 | |
|     previousValue = integerCodebook[j] | |
|   } | |
| } | | tensor_dimension_list( ) is defined as follows:

| | Descriptor |
|---|---|
| tensor_dimension_list( ){ | |
|   count_tensor_dimensions | ue(1) |
|   for(j = 0; j < count_tensor_dimensions; j++) | |
|     tensor_dimensions [j] | ue(7) |
| } | | topology_elements_ids_list( ) is defined as follows:

| | Descriptor |
|---|---|
| topology_elements_ids_list( ) { | |
|   count_topology_elements_minus2 | u(8) |
|   for(j = 0; j < count_topology_elements_minus2 + 2; j++ ) | |
|     topology_elem_id_list[j] | st(v) |
| } | | topology tensor_dimension mapping( ) is defined as follows:

| | Descriptor |
|---|---|
| topology_tensor_dimension_mapping ( ) { | |
|   concatentation_axis_index | u(8) |
|   for(j = 0; j < count_topology_elements_minus2 + 1 ; j++ ) | |
|     split_index[j] | ue(7) |
| } | |

NNR aggregate unit header syntax

| | Descriptor |
|---|---|
| nnr_aggregate_unit_header( ) { | |
|   nnr_aggregate_unit_type | u(8) |
|   entry_points_present_flag | u(1) |
|   nnr_reserved_zero_7bits | u(7) |
|   num_of_nnr_units_minus2 | u(16) |
|   if( entry_points_present_flag ) | |
|     for(i = 0; i < num_of_nnr_units_minus2 + 2; i++) { | |
|       nnr_unit_type[ i ] | u(6) |
|       nnr_unit_entry_point[ i ] | u(34) |
|     } | |
|   for(i = 0; i < num_of_nnr_units_minus2 + 2; i++) { | |
|     quant_bitdepth[i] | u(5) |
|     if(mps_unification_flag || lps_unification_flag){ | |
|       ctu_scan_order[i] | u(1) |
|       nnr_reserved_zero_2bits | u(2) |
|     } | |
|     else | |
|       nnr_reserved_zero_3bits | u(3) |
|   } | |
| } | |

NNR unit payload syntax

| | Descriptor |
|---|---|
| nnr_unit_payload( ) { | |
|   if( nnr_unit_type == NNR_MPS ) | |
|     nnr_model_parameter_set_payload( ) | |
|   if( nnr_unit_type == NNR_LPS ) | |
|     nnr_layer_parameter_set_payload( ) | |
|   if( nnr_unit_type == NNR_TPL ) | |
|     nnr_topology_unit_payload( ) | |
|   if( nnr_unit_type == NNR_QNT ) | |
|     nnr_quantization_unit_payload( ) | |
|   if( nnr_unit_type == NNR_NDU ) | |
|     nnr_compressed_data_unit_payload( ) | |
|   if( nnr_unit_type == NNR_STR ) | |
|     nnr_start_unit_payload( ) | |
|   if( nnr_unit_type == NNR_AGG ) | |
|     nnr_aggregate_unit_payload( ) | |
| } | |

NNR start unit payload syntax

| | Descriptor |
|---|---|
| nnr_start_unit_payload( ) { | |
| } | |

NNR model parameter set payload syntax

| | Descriptor |
|---|---|
| nnr_model_parameter_set_payload( ) { | |
|   topology_carriage_flag | u(1) |
|   mps_sparsification_flag | u(1) |
|   mps_pruning_flag | u(1) |
|   mps_unification_flag | u(1) |
|   mps_decomposition_performance_map_flag | u(1) |
|   mps_quantization_method_flags | u(3) |

```
if((mps_quantization_method_flags & NNR_QSU) ==
NNR_QSU || (mps_quantization_method_flags &
NNR_QCB) == NNR_QCB) {
    mps_qp_density                                    u(3)
    mps_quantization_parameter                        i(13)
}
if(mps_sparsification_flag == 1)
    sparsification_performance_map( )
if(mps_pruning_flag == 1)
    pruning_performance_map( )
if(mps_unification_flag == 1)
    unification_performance_map( )
if(mps_decomposition_performance_map_flag == 1)
    decomposition_performance_map( )
}
```

| sparsification_performance_map( ) | |
|---|---|
| | Descriptor |
| sparsification_performance_map( ) { | |
|   spm_count_thresholds | u(8) |
|   for(i = 0; i < (spm_count_thresholds−1); i++ ) { | |
|     sparsification_threshold[i] | flt(32) |
|     non_zero_ratio[i] | flt(32) |
|     spm_nn_accuracy[i] | flt(32) |
|     spm_count_classes [i] | u(8) |
|     for (j = 0; j < (spm_count_classes[i]−1); j++ ) | |
|       spm_nn_class_accuracy[i][j] | flt(32) |
|   } | |
| } | |

| pruning_performance_map( ) is defined as follows: | |
|---|---|
| | Descriptor |
| pruning_performance_map( ) { | |
|   ppm_count_pruning_ratios | u(8) |
|   for (i = 0; i < (ppm_count_pruning_ratios−1); i++ ) { | |
|     pruning_ratio[i] | flt(32) |
|     ppm_nn_accuracy[i] | flt(32) |
|     ppm_count_classes [i] | u(8) |
|     for (j = 0; j < (ppm_count_classes[i]−1); j++ ) | |
|       ppm_nn_class_accuracy[i][j] | flt(32) |
|   } | |
| } | |

| unification_performance_map( ) is defined as follows: | |
|---|---|
| | Descriptor |
| unification_performance_map( ) { | |
|   upm_count_thresholds | u(8) |
|   for(i = 0; i < (upm_count_thresholds−1); i++ ) { | |
|     count_reshaped_tensor_dimension | ue(1) |
|     for(j = 0; j < (count_reshaped_tensor_dimension−1); j++ ) | |
|       reshaped_tensor_dimensions[j] | ue(7) |
|     byte_alignment( ) | |
|     count_super_block_dimension | u(8) |
|     for(j = 0; j < (count_super_block_dimension−1); j++ ) | |
|       super_block_dimensions[j] | u(8) |
|     count_block_dimension | u(8) |
|     for (j = 0; j < (count_block_dimension−1); j++ ) | |
|       block_dimensions[j] | u(8) |
|     unification_threshold[i] | flt(32) |
|     upm_nn_accuracy[i] | flt(32) |
|     upm_count_classes [i] | u(8) |
|     for(j = 0; j < (upm_count_classes[i]−1); j++ ) | |
|       upm_nn_class_accuracy[i][j] | flt(32) |
|   } | |
| } | |

| decomposition_performance_map( ) is defined as follows: | |
|---|---|
| | Descriptor |
| decomposition_performance_map( ) { | |
|   dpm_count_thresholds | u(8) |
|   for(i = 0; i < (dpm_count_thresholds−1); i++ ) { | |
|     mse_threshold[i] | flt(32) |
|     dpm_nn_accuracy[i] | flt(32) |
|     nn_reduction_ratio[i] | flt(32) |
|     dpm_count_classes[i] | u(16) |
|     for(j = 0; j < (dpm_count_classes[i]−1); j++ ) | |
|       dpm_nn_class_accuracy[i][j] | flt(32) |
|   } | |
| } | |

| NNR layer parameter set unit payload syntax | |
|---|---|
| | Descriptor |
| nnr_layer_parameter_set_unit_payload( ) { | |
|   nnr_reserved_zero_1_bits | u(1) |
|   lps_sparsification_flag | u(1) |
|   lps_pruning_flag | u(1) |
|   lps_unification_flag | u(1) |
|   lps_quantization_method_flags | u(3) |
|   nnr_reserved_zero_1bit | u(1) |
|   if((lps_quantization_method_flags & NNR_QCB) == | |
|   NNR_QCB (lps_quantization_method_flags & | |
|   NNR_QSU) == NNR_QSU) { | |
|     lps_qp_density | u(3) |
|     lps_quantization_parameter | i(13) |
|   } | |
|   if(lps_sparsification_flag == 1) | |
|     sparsification_performance_map( ) | |
|   if(lps_pruning_flag == 1) | |
|     pruning_performance_map( ) | |
|   if(lps_unification_flag == 1) | |
|     unification_performance_map( ) | |
| } | |

| nnr_topology_unit_payload( ) syntax | |
|---|---|
| | Descriptor |
| nnr_topology_unit_payload( ) { | |
|   if( topology_storage_format = = NNR_TPL_PRUN ) | |
|     nnr_pruning_topology_container( ) | |
|   else | |
|     topology_data | bs(v) |
| } | |

| nnr_pruning_topology_container( ) is specified as follows: | |
|---|---|
| | Descriptor |
| nnr_pruning_topology_container( ) { | |
|   nnr_rep_type | u(2) |
|   prune_flag | u(1) |
|   order_flag | u(1) |
|   sparse_flag | u(1) |
|   nnr_reserved_zero_3bits | u(3) |
|   if (prune_flag == 1) { | |
|     if (nnr_rep_type == NNR_TPL_BMSK) | |
|       bit_mask( ) | |
|     else if (nnr_rep_type == NNR_TPL_DICT) { | |
|       count_ids | u(8) |
|       for (j = 0; j < count_ids; j ++) | |
|         element_id[j] | st(v) |
|       for (j = 0; j < count_ids; j ++) { | |
|         count_dims [j] | ue(1) |
|         for(k = 0; k < count_dims; k++){ | |
|           dim[j][k] | ue(7) |
|         } | |
|       } | |
|       byte_alignment( ) | |
|     } | |
|   } | |
| } | |

-continued

```
if (sparse_flag == 1) {
    bit_mask( )
  }
}
```

| bit_mask( ) is specified as follows: | |
|---|---|
| | Descriptor |
| bit_mask( ) { | |
|   count_bits | u(32) |
|   for(j = 0; j < count_bits; j++ ) { | |
|     bit_mask_value[j] | u(1) |
|   } | |
|   byte_alignment( ) | |
| } | |

| NNR quantization unit payload syntax | |
|---|---|
| | Descriptor |
| nnr_quantization_unit_payload( ) { | |
|   quantization_data | bs(v) |
| } | |

| NNR compressed data unit payload syntax | |
|---|---|
| | Descriptor |
| nnr_compressed_data_unit_payload( ) { | |
|   if( nnr_compressed_data_unit_payload_type == NNR_PT_RAW_FLOAT ) | |
|     for( i = 0; i < Prod( TensorDimensions ); i++ ) | |
|       raw_float32_parameter[ TensorIndex( TensorDimensions, i , 0 ) ] | flt(32) |
|   Invoke *** | |
| } | | where *** relates to a certain decoding method for NNR compressed payload depending on the value of the nnr_compressed_data_unit_payload_type.

| NNR aggregate unit payload syntax | |
|---|---|
| | Descriptor |
| nnr_aggregate_unit_payload( ) { | |
|   for(i = 0; i < num_of_nnr_units_minus2 + 2; i++) | |
|     nnr_unit( ) | |
| } | |

| Byte alignment syntax | |
|---|---|
| | Descriptor |
| byte_alignment( ) { | |
|   alignment_bit_equal_to_one /* equal to 1 */ | f(1) |
|   while( !byte_aligned( ) ) | |
|     alignment_bit_equal_to_zero /* equal to 0 */ | f(1) |
| } | |

Semantics associated with the syntax structures and elements within these structures are specified in the following paragraphs. When the semantics of a syntax element are specified using a table or a set of tables, any values that are not specified in the table(s) shall not be present in the bitstream unless otherwise specified in this document.

NNR Unit Size Semantics nnr_unit_size_flag specifies the number of bits used as the data type of the nnr_unit_size. If this value is 0, then nnr_unit_size is a 15 bits unsigned integer value, otherwise it is 31 bits unsigned integer value.

nnr_unit_size specifies the size of the NNR unit, which is the sum of byte sizes of nnr_unit_size( ), nnr_unit_header( ) and nnr_unit_payload( ).

NNR Unit Header Semantics nnr_unit_type specifies the type of the NNR unit, as specified in the following table.

TABLE 1

NNR Unit Types

| nnr_unit_type | Identifier | NNR Unit Type | Description |
|---|---|---|---|
| 0 | NNR_STR | NNR start unit | Compressed neural network bitstream start indicator |
| 1 | NNR_MPS | NNR model parameter set data unit | Neural network global metadata and information |
| 2 | NNR_LPS | NNR layer parameter set data unit | Metadata related to a partial representation of neural network |
| 3 | NNR_TPL | NNR topology data unit | Neural network topology information |
| 4 | NNR_QNT | NNR quantization data unit | Neural network quantization information |
| 5 | NNR_NDU | NNR compressed data unit | Compressed neural network data |
| 6 | NNR_AGG | NNR aggregate unit | NNR unit with payload containing multiple NNR units |
| 7 ... 31 | NNR_RSVD | Reserved | ISO/IEC-reserved range |
| 32 ... 63 | NNR_UNSP | Unspecified | Unspecified range |

The values in the range NNR_RSVD are reserved for used in future versions of the standard or related specifications. Encoders may not use these values. Decoders conforming to this version of the specification may ignore NNR units using these values. The values in the range NNR_UNSP are not specified, their use is outside the scope of this specification. Decoders conforming to this version of the specification may ignore NNR units using these values.

independently_decodable_flag specifies whether this compressed data unit is independently decodable. A value of 1 indicates an independently decodable NNR Unit. A value of 0 indicates that this NNR Unit is not independently decodable and its payload should be combined with other NNR Units for successful decodability/decompressibility. The value of independently_decodable_flag shall be the same for all NNR Units which refer to the same topology_elem_id value or the same topology_elem_id_list.

partial_data_counter_present_flag equal to 1 specifies that the syntax element partial_data_counter is present in NNR unit header. partial_data_counter_present_flag equal to 0 specifies that the syntax element partial_data_counter is not present in NNR unit header.

partial_data_counter specifies the index of the partial data carried in the payload of this NNR Data Unit with respect to the whole data for a certain topology element. A value of 0 indicates no partial information (i.e., the data in this NNR Unit is all data associated to a topology element and it is complete), a value bigger than 0 indicates the index of the partial information (i.e., data in this NNR Unit should be concatenated with the data in accompanying NNR Units until partial_data_counter of an NNR Unit reaches 1). This counter counts backwards to indicate initially the total number of partitions. If not present, the value of partial_data_counter is inferred to be equal to 0. If the value of independently_decodable_flag is equal to 0, the value of partial_data_counter_present_flag shall be equal to 1 and the value of partial_data_counter shall be greater than 0. If the value of independently_decodable_flag is equal to 1, the values of partial_data_counter_present_flag and partial_data_counter are undefined, in this version of this document.

It is to be noticed that if the value of independently_decodable_flag is equal to 1 and if partial_data_counter_present_flag is equal to 1, partial_data_counter may have non-zero values, based on the assumption that multiple independently decodable NNR units are combined to construct a model.

NNR Start Unit Header Semantics general_profile_idc indicates a profile to which NNR bitstream conforms as specified in this document. Reserved for future use.

NNR Model Parameter Set Unit Header Semantics

Header elements of the model parameter set (reserved for future use).

NNR Layer Parameter Set Unit Header Semantics lps_self_contained_flag equal to 1 specifies that NNR units that refer to the layer parameter set are a full or partial NN model and shall be successfully reconstructable with the NNR units. A value of 0 indicates that the NNR Units that refer to the layer parameter set should be combined with NNR Units that refer to other layer parameter sets for successful reconstruction of a full or partial NN model.

NNR Topology Unit Header Semantics topology_storage_format specifies the format of the stored neural network topology information, as specified in the Table 2 below:

TABLE 2

Topology storage format identifiers.

| topology_storage_format value | Identifier | Description |
|---|---|---|
| 0 | NNR_TPL_UNREC | Unrecognized topology format |
| 1 . . . 4 | | See annexes A-D of ISO/IEC DIS 15938-17 for further information. |
| 5 | NNR_TPL_PRUN | Topology pruning information |
| 6 . . . 127 | NNR_TPL_RSVD | ISO/IEC-reserved range |
| 128 . . . 255 | NNR_TPL_UNSP | Unspecified range |

The value NNR_PL_UNREC indicates that the topology format is unknown. Encoders may use this value if the topology format used is not among the set of formats for which identifiers are specified. Decoders conforming to this version of the specification may ignore NNR units using this value or may attempt to recognize the format by parsing the start of the topology payload. The values in the range NNR_TPL_RSVD are reserved for used in future versions of this or related specifications. Encoders must not use these values. Decoders conforming to this version of the specification may ignore NNR units using these values. The values in the range NNR_TPL_UNSP are not specified, their use is outside the scope of this specification. Decoders conforming to this version of the specification may ignore NNR units using these values.

compressed_topology_flag, when set to 1 indicates that the topology information inside the NNR_TPL units are further compressed. Otherwise, they are stored in an uncompressed format.

topology_compression_format specifies that one of the following compression formats is applied on the stored topology data in topology_data:

TABLE 3

Topology compression format identifiers.

| topology_compression_format | Identifier | NNR Aggregate Unit Type |
|---|---|---|
| 0x00 | NNR_PT_RAW | Uncompressed |
| 0x01 | NNR_DFL | Deflate as defined in RFC 1950 |
| 0x02-0x7F | | Reserved |

NNR Quantization Unit Header Semantics quantization_storage_format specifies the format of the stored neural network quantization information, as specified in Table 6 below:

TABLE 4

Quantization storage format identifiers.

| quantization_storage_format value | Identifier | Description |
|---|---|---|
| 0 | NNR_QNT_UNREC | Unrecognized quantization format. |
| 1 . . . 4 | | See annexes A-D for further information. |
| 5 . . . 127 | NNR_QNT_RSVD | MPEG-reserved range |
| 128 . . . 255 | NNR QNT_UNSP | Unspecified range |

The value NNR_QNT_UNREC indicates that the quantization format is unknown. Encoders may use this value if the quantization format used is not among the set of formats for which identifiers are specified. Decoders conforming to this version of the specification may ignore NNR units using this value or may attempt to recognize the format by parsing the start of the topology payload.

The values in the range NNR_QNT_RSVD are reserved for used in future versions of this or related specifications. Encoders must not use these values. Decoders conforming to this version of the specification may ignore NNR units using these values. The values in the range NNR_QNT_UNSP are not specified, their use is outside the scope of this specification. Decoders conforming to this version of the specification may ignore NNR units using these values.

quantization_compressed_flag, when set to 1 indicates that the quantization information inside the NNR_QNT units are further compressed. Otherwise, they are stored in an uncompressed format.

quantization_compression_format specifies that one of the following compression formats—shown in Table 7—is applied on the stored quantization data in quantization_data:

TABLE 5

Quantization compression format identifiers.

| quantization_compression_format | Identifier | NNR Aggregate Unit Type |
|---|---|---|
| 0x00 | NNR_PT_RAW | Uncompressed |
| 0x01 | NNR_DFL | Deflate as defined in RFC 1950 |
| 0x02-0x7F | | Reserved |

NNR Compressed Data Unit Header Semantics nnr_compressed_data_unit_payload_type can be an integer parameter tensor, float parameter tensor, uncompressed float parameter tensor or a float parameter tensor, including a (optionally decomposed) weight tensor and, optionally, local scaling parameters biases, and batch norm parameters that form a block in the model architecture.

nnr_multiple_topology_elements_present_flag specifies whether multiple topology units are present in the bitstream. In case there are multiple units, the list of their IDs is included.

nnr_decompressed_data_format_present_flag specifies whether the data format to be obtained after decompression is present in the bitstream.

input_parameters_present_flag specifies whether the group of elements including tensor dimensions, DeepCABAC unary length and compressed parameter types is present in the bitstream.

topology_elem_id specifies a unique identifier for the topology element to which an NNR compressed data unit refers. The semantic interpretation of this field is context dependent.

count_topology_elements_minus2+2 specifies the number of topology elements for which this NNR compressed data unit carries data in the payload.

codebook_present_flag specifies whether codebooks are used. If codebook_present_flag is not present, it is inferred to be 0.

dq_flag specifies whether the quantization method is dependent scalar quantization or uniform quantization. A dq_flag equal to 0 indicates that the uniform quantization method is used. A dq_flag equal to 1 indicates that the dependent scalar quantization method is used. If dq_flag is not present, it is inferred to be 0.

nnr_decompressed_data_format can be a tensor of integer values used for representing tensor-shaped signed integer parameters of the model or a tensor of float values used for representing tensor-shaped float parameters of the model.

tensor_dimensions_flag specified whether the tensor dimensions are defined in the bitstream. If they are not included in the bitstream, they shall be obtained from the model topology description.

cabac_unary_length_flag specifies whether the length of the unary part in the DeepCABAC binarization is included in the bitstream.

compressed_parameter_types specifies the compressed parameter types present in the current topology element to which an NNR compressed data unit refers. If multiple compressed parameter types are specified, they are combined by OR. The following compressed parameter types, from the Table 8, are defined.

TABLE 6

Compressed parameter type identifiers.

| Compressed parameter type | Compressed parameter type ID | Bit in compressed_parameter_types |
|---|---|---|
| Decomposition present | NNR_CPT_DC | 0x01 |
| Local scaling present | NNR_CPT_LS | 0x02 |
| Batch norm parameters present | NNR_CPT_BN | 0x04 |
| Bias present | NNR_CPT_BI | 0x08 |

When decomposition is present, the tensors G and H represent the result of decomposing the original tensor. If (compressed_parameter_types & NNR_CPT_DC) !=0 the variables TensorDimensionsG and TensorDimensionsH are derived as follows:

Variable TensorDimensionsG is set to [g_number_of_rows, decomposition_rank].

Variable TensorDimensionsH is set to [decomposition_rank, hNumberOfColumns] where hNumberOfColumns is defined as $$hNumberOfColumns = \frac{\prod_{i=0}^{count\_tensor\_dimensions-1} tensor\_dimensions[i]}{g\_number\_of\_rows}$$

If (compressed_parameter_types & NNR_CPT_DC) !=0 and if nnr_compressed_data_unit_payload_type !=NNR_PT_BLOCK, the NNR unit contains a decomposed tensor G and the next NNR unit in the bitstream contains the corresponding decomposed tensor H.

A variable TensorDimensions is derived as follows:
If an NNR unit contains a decomposed tensor G and nnr_compressed_data_unit_payload_type NNR_PT_BLOCK, TensorDimensions is set to TensorDimensionsG.
Otherwise, if an NNR unit contains a decomposed tensor H and nnr_compressed_data_unit_payload_type != NNR_PT_BLOCK, TensorDimensions is set to TensorDimensionsH.
Otherwise, TensorDimensions is set to tensor_dimensions.

A variable NumBlockRowsMinus1 is defined as follows:
If scan_order is equal to 0, NumBlockRowsMinus1 is set to 0.
Otherwise, if nnr_compressed_data_unit_payload_type NNR_PT_BLOCK and (compressed_parameter_types & NNR_CPT_DC) !=0, NumBlockRowsMinus1 is set to ((TensorDimensionsG[0]+(4<<scan_order)−1)>>(2+scan_order))+((TensorDimensionsH[0]+(4<<scan_order)−1)>>(2+scan_order))−2.
Otherwise, NumBlockRowsMinus1 is set to ((TensorDimensions[0]+(4<<scan_order)−1)>>(2+scan_order))−1.

decomposition_rank specifies the rank of the low-rank decomposed weight tensor components relative to tensor_dimensions.

g_number_of_rows specifies the number of rows of matrix G in the case where the reconstruction is performed for decomposed tensors in an NNR unit of type NNR_PT_BLOCK cabac_unary_length specifies the length of the unary part in the DeepCABAC binarization.

scan_order specifies the block scanning order for parameters with more than one dimension according to the following table:
  0: No block scanning
  1: 8×8 blocks
  2: 16×16 blocks
  3: 32×32 blocks
  4: 64×64 blocks cabac_offset_list specifies a list of values to be used to initialize variable IvlOffset at the beginning of entry points.

dq_state_list specifies a list of values to be used to initialize variable stateId at the beginning of entry points.

bit_offset_delta1 specifies the first element of list BitOffsetList.

bit_offset_delta2 specifies elements of list BitOffsetList except for the first element, as difference to the previous element of list BitOffsetList.

Variable BitOffsetList is a list of bit offsets to be used to set the bitstream pointer position at the beginning of entry points.

codebook_egk specifies the Exp-Golomb parameter k for decoding of syntax elements codebook_delta_left and codebook_delta_right.

codebook_size specifies the number of elements in the codebook.

codebook_centre_offset specifies an offset for accessing elements in the codebook relative to the centre of the codebook. It is used for calculating variable CbZeroOffset.

codebook_zero_value specifies the value of the codebook at position CbZeroOffset. It is involved in creating variable Codebook (the array representing the codebook).

codebook_delta_left specifies the difference between a codebook value and its right neighbour minus 1 for values left to the centre position. It is involved in creating variable Codebook (the array representing the codebook).

codebook_delta_right specifies the difference between a codebook value and its left neighbour minus 1 for values right to the centre position. It is involved in creating variable Codebook (the array representing the codebook).

count_tensor_dimensions specifies a counter of how many dimensions are specified. For example, for a 4-dimensional tensor, count_tensor_dimensions is 4. If it is not included in the bitstream, it shall be obtained from the model topology description.

tensor_dimensions specifies an array or list of dimension values. For example, for a convolutional layer, tensor_dimensions is an array or list of length 4. For NNR units carrying elements G or H of a decomposed tensor, tensor_dimensions is set to the dimensions of the original tensor. The actual tensor dimensions of G and H for the decoding methods are derived from tensor_dimensions, decomposition_rank, and g_number_of_rows. If it is not included in the bitstream, it shall be obtained from the model topology description.

topology_elem_id_list specifies a list of unique identifiers related to the topology element to which an NNR compressed data unit refers. Elements of topology_elem_id_list are semantically equivalent to syntax element topology_elem_id. The semantic interpretation of this field is context dependent.

concatentation_axis_index indicates the 0-based concatenation axis.

split_index[ ] indicates the tensor splitting index along the concatenation axis indicated by concatenation_axis_index in order to generate each individual tensor which is concatenated.

NNR Aggregate Unit Header Semantics nnr_aggregate_unit_type specifies the type of the aggregate NNR unit.

The following NNR aggregate unit types are specified, as presented in Table 7:

TABLE 7

NNR aggregate unit types.

| nnr_aggregate_unit_type | Identifier | NNR Aggregate Unit Type | Description |
|---|---|---|---|
| 0 | NNR_AGG_GEN | Generic NNR aggregate unit | A set of NNR units |
| 1 | NNR_AGG_SLF | Self-contained NNR aggregate unit | When extracted and then concatenated with an NNR_STR and NNR_MPS, an NNR_AGG_SLF shall be decodable without any need of additional information and a full or partial NN model shall be successfully reconstructable with it. |
| 2 . . . 127 | NNR_RSVD | Reserved | ISO/IEC-reserved range |
| 128 . . . 255 | NNR_UNSP | Unspecified | Unspecified range |

The values in the range NNR_NNR_RSVD are reserved for used in future versions of this or related specifications. Encoders must not use these values. Decoders conforming to this version of the specification may ignore NNR units using these values. The values in the range NNR_UNSP are not specified, their use is outside the scope of this specification. Decoders conforming to this version of the specification may ignore NNR units using these values.

entry_points_present_flag specifies whether individual NNR unit entry points are present.

num_of_nnr_units_minus2+2 specifies the number of NNR units present in the NNR aggregate unit's payload.

nnr_unit_type[i] specifies the NNR unit type of the NNR unit with index i. This value shall be the same as the NNR unit type of the NNR unit at index i.

nnr_unit_entry_point[i] specifies the byte offset from the start of the NNR aggregate unit to the start of the NNR unit in NNR aggregate unit's payload and at index i. This value shall not be equal or greater than the total byte size of the NNR aggregate unit. nnr_unit_entry_point values can be used for fast and random access to NNR units inside the NNR aggregate unit payload.

quant_bitdepth[i] specify the max bit depth of quantized coefficients for each tensor in the NNR aggregate unit.

ctu_scan_order[i] specify the CTU-wise scan order for each tensor in the NNR aggregate unit. Value 0 indicates that the CTU-wise scan order is raster scan order at horizontal direction, value 1 indicates that the CTU-wise scan order is raster scan order at vertical direction.

NNR Unit Payload Semantics

The following NNR unit payload types are specified:

NNR Start Unit Payload Semantics

Start unit payload (reserved for future use).

NNR Model Parameter Set Payload Semantics topology_carriage_flag specifies whether the NNR bitstream carries the topology internally or externally. When set to 1, it specifies that topology is carried within one or more NNR unit types "NNR_TPL". If 0, it specifies that topology is provided externally (i.e., out-of-band with respect to the NNR bitstream).

mps_sparsification_flag specifies whether sparsification is applied to the model in the NNR Compressed Data Units that utilize this Model Parameter Set.

mps_pruning_flag specifies whether pruning is applied to the model in the NNR Compressed Data Units that utilize this Model Parameter Set.

mps_unification_flag specifies whether unification is applied to the model in the NNR Compressed Data Units that utilize this Model Parameter Set.

mps_decomposition_performance_map_flag equal to 1 specifies that tensor decomposition was applied to at least one layer of the model and a corresponding performance map is transmitted.

mps_quantization_method_flags specifies the quantization method(s) used for the model in the NNR Compressed Data Units that utilize this model parameter set. If multiple models are specified, they are combined by OR. The following methods are defined, as presented in Table 8.

TABLE 8

Quantization method identifiers.

| Quantization method | Quantization method ID | Value |
|---|---|---|
| Scalar uniform | NNR_QSU | 0x01 |
| Codebook | NNR_QCB | 0x02 |
| Reserved | | 0x04-0x07 | mps_qp_density specifies density information of syntax element mps_quantization_parameter in the NNR Compressed Data Units that utilize this Model Parameter Sets.

mps_quantization_parameter specifies the quantization parameter for scalar uniform quantization of parameters of each layer of the neural network for arithmetic coding in the NNR Compressed Data Units that utilize this Model Parameter Set.

sparsification_performance_map( ) specifies a mapping between different sparsification thresholds and resulting NN inference accuracies. The resulting accuracies are provided separately for different aspects or characteristics of the output of the NN. For a classifier NN, each sparsification threshold is mapped to separate accuracies for each class, in addition to an overall accuracy which considers all classes. Classes are ordered based on the neural network output order, i.e, the order specified during training.

spm_count_thresholds specifies the number of sparsification thresholds. This number shall be non-zero.

sparsification_threshold specifies a list of thresholds where each threshold is applied to the weights of the decoded neural network in order to set the weights to zero. I.e., the weights whose values are less than the threshold are set to zero.

non_zero_ratio specifies a list of non-zero ratio values where each value is the non-zero ratio that is achieved by applying the sparsification_threshold to sparsify the weights.

spm_nn_accuracy specifies a list of accuracy values where each value is the overall accuracy of the NN (e.g., classification accuracy by considering all classes) when sparsification using the corresponding threshold in sparsification_threshold is applied.

spm_count_classes specifies a list of number of classes where each such number is the number of classes for which separate accuracies are provided for each sparsification thresholds.

spm_nn_class_accuracy specifies a list of lists of class accuracies, where each value is accuracy for a certain class, when a certain sparsification threshold is applied.

pruning_performance_map( ) specifies a mapping between different pruning ratios and resulting NN inference accuracies. The resulting accuracies are provided separately for different aspects or characteristics of the output of the NN. For a classifier NN, each pruning ratio is mapped to separate accuracies for each class, in addition to an overall accuracy which considers all classes. Classes are ordered based on the neural network output order, i.e, the order specified during training.

ppm_count_pruning_ratios specifies the number of pruning ratios.

pruning_ratio specifies the pruning ratio.

ppm_nn_accuracy specifies a list of accuracy values where each value is the overall accuracy of the NN (e.g., classification accuracy by considering all classes) when pruning using the corresponding ratio in pruning_ratio is applied.

ppm_count_classes specifies a list of number of classes where each such number is the number of classes for which separate accuracies are provided for each pruning ratio.

ppm_nn_class_accuracy specifies a list of lists of class accuracies, where each value is accuracy for a certain class, when a certain pruning ratio is applied.

unification_performance_map( ) specifies a mapping between different unification thresholds and resulting NN inference accuracies. The resulting accuracies are provided separately for different aspects or characteristics of the output of the NN. For a classifier NN, each unification threshold is mapped to separate accuracies for each class, in addition to an overall accuracy which considers all classes. Classes are ordered based on the neural network output order, i.e, the order specified during training.

upm_count_thresholds specifies the number of unification thresholds. This number shall be non-zero.

count_reshaped_tensor_dimensions specifies a counter of how many dimensions are specified for reshaped tensor. For example, for a weight tensor reshaped to 3-dimensional tensor, count_reshaped_tensor_dimensions is 3.

reshaped_tensor_dimensions specifies an array or list of dimension values. For example, for a convolutional layer reshaped to 3-dimensional tensor, dim is an array or list of length 3.

count_super_block_dimensions specifies a counter of how many dimensions are specified. For example, for a 3-dimensional super block, count_super_block_dimensions is 3.

super_block_dimensions specifies an array or list of dimension values. For example, for a 3-dimensional super block, dim is an array or list of length 3, i.e. [64, 64, kernel_size].

count_block_dimensions specifies a counter of how many dimensions are specified. For example, for a 3-dimensional block, count_block_dimensions is 3.

block_dimensions specifies an array or list of dimension values. For example, for a 3-dimensional block, dim is an array or list of length 3, i.e. [2, 2, 2].

unification_threshold specifies the threshold which is applied to tensor block in order to unify the absolute value of weights in this tensor block.

upm_nn_accuracy specifies the overall accuracy of the NN (e.g., classification accuracy by considering all classes).

upm_count_classes specifies number of classes for which separate accuracies are provided for each unification thresholds.

upm_nn_class_accuracy specifies the accuracy for a certain class, when a certain unification threshold is applied.

decomposition_performance_map( ) specifies a mapping between different Mean Square Error (MSE) thresholds between the decomposed tensors and their original version and resulting NN inference accuracies. The resulting accuracies are provided separately for different aspects or characteristics of the output of the NN. For a classifier NN, each MSE threshold is mapped to separate accuracies for each class, in addition to an overall accuracy which considers all classes. Classes are ordered based on the neural network output order, i.e, the order specified during training.

dpm_count_thresholds specifies the number of decomposition MSE thresholds. This number shall be non-zero.

mse_threshold specifies an array of MSE thresholds which are applied to derive the ranks of the different tensors of weights.

dpm_nn_accuracy specifies the overall accuracy of the NN (e.g., classification accuracy by considering all classes).

nn_reduction_ratio[i] specifies the ratio between the total number of parameters after tensor decomposition of the whole model and the number of parameters in the original model dpm_count_classes specifies number of classes for which separate accuracies are provided for each decomposition thresholds.

dpm_nn_class_accuracy specifies an array of accuracies for a certain class, when a certain decomposition threshold is applied.

NNR Layer Parameter Set Unit Payload Semantics lps_sparsification_flag specifies whether sparsification was applied to the model in the NNR Compressed Data Units that utilizes this Layer Parameter Set.

lps_pruning_flag specifies whether pruning was applied to the model in the NNR Compressed Data Units that utilizes this Layer Parameter Set.

lps_unification_flag specifies whether unification was applied to the model in the NNR Compressed Data Units that utilizes this Layer Parameter Set.

lps_quantization_method_flags specifies the quantization method used for the data contained in the NNR Compressed Data Units to which this Layer Parameter Set refers. If multiple models are specified, they are combined by OR. The following methods are defined, as presented in Table 9.

TABLE 9

Quantization method identifiers.

| Quantization method | Quantization method ID | Value |
| --- | --- | --- |
| Scalar uniform | NNR_QSU | 0x01 |
| Codebook | NNR_QCB | 0x02 |
| Reserved | | 0x04-0x07 | lps_qp_density specifies density information of syntax element lps_quantization_parameter in the NNR Compressed Data Units that utilize this Model Parameter Set.

lps_quantization_parameter specifies the quantization parameter for scalar uniform quantization of parameters of each layer of the neural network for arithmetic coding in the NNR Compressed Data Units that utilize this Model Parameter Set.

The variable QpDensity is derived as follows:
If an active NNR layer parameter set is present, the variable QpDensity is set to lps_qp_density.
Otherwise, the variable QpDensity is set to mps_qp_density.

The variable QuantizationParameter is derived as follows:
If an active NNR layer parameter set is present, the variable QuantizationParameter is set to lps_quantization_parameter.
Otherwise, the variable QuantizationParameter is set to mps_quantization_parameter.

sparsification_performance_map( ) specifies a mapping between different sparsification thresholds and resulting NN inference accuracies. The resulting accuracies are provided separately for different aspects or characteristics of the output of the NN. For a classifier NN, each sparsification threshold is mapped to separate accuracies for each class, in addition to an overall accuracy which considers all classes. Classes are ordered based on the neural network output order, i.e, the order specified during training. When lps_sparsification_flag of a certain layer is equal to 1 and mps_sparsification_flag is equal to 0, then the information in sparsification_performance_map( ) of the layer parameter set is valid when performing sparsification only on that layer. More than one layer can have lps_sparsification_flag equal to 1 in their layer parameter set.

When both mps_sparsification_flag and lps_sparsification_flag are equal to 1, the following shall apply:
If sparsification is applied on the whole model (i.e., all layers), then the information in sparsification_performance_map( ) of the model parameter set is valid.
If sparsification is applied on only one layer, and for that layer lps_sparsification_flag is equal to 1, then the information in sparsification_performance_map( ) of the layer parameter set of that layer is valid.

pruning_performance_map( ) specifies a mapping between different pruning ratios and resulting NN inference accuracies. The resulting accuracies are provided separately for different aspects or characteristics of the output of the NN. For a classifier NN, each pruning ratio is mapped to separate accuracies for each class, in addition to an overall accuracy which considers all classes. Classes are ordered based on the neural network output order, i.e, the order specified during training. When lps_pruning_flag of a certain layer is equal to 1 and mps_pruning_flag is equal to 0, then the information in pruning_performance_map( ) of the layer parameter set is valid when performing pruning only on that layer. More than one layer can have lps_pruning_flag equal to 1 in their layer parameter set.

When both mps_pruning_flag and lps_pruning_flag are equal to 1, the following shall apply:
If pruning is applied on the whole model (i.e., all layers), then the information in pruning_performance_map( ) of the model parameter set is valid.
If pruning is applied on only one layer, and for that layer lps_pruning_flag is equal to 1, then the information in pruning_performance_map( ) of the layer parameter set of that layer is valid.

unification_performance_map( ) specifies a mapping between different unification thresholds and resulting NN inference accuracies. The resulting accuracies are provided separately for different aspects or characteristics of the output of the NN. For a classifier NN, each unification threshold is mapped to separate accuracies for each class, in addition to an overall accuracy which considers all classes. Classes are ordered based on the neural network output order, i.e., the order specified during training. When Ips_unification_flag of a certain layer is equal to 1 and mps_unification_flag is equal to 0, then the information in unification_performance_map( ) of the layer parameter set is valid when performing unification only on that layer. More than one layer can have Ips_unification_flag equal to 1 in their layer parameter set.

When both mps_unification_flag and Ips_unification_flag are equal to 1, the following shall apply:
  If unification is applied on the whole model (i.e., all layers), then the information in unification_performance_map( ) of the model parameter set is valid.
  If unification is applied on only one layer, and for that layer Ips_unification_flag is equal to 1, then the information in unification_performance_map( ) of the layer parameter set of that layer is valid.

NNR Topology Unit Payload Semantics
  topology_storage_format value is as signaled in the corresponding NNR topology unit header of the same NNR unit of type NNR_TPL.
  topology_data is a byte sequence of length determined by the NNR unit size describing the neural network topology, in the format specified by topology_storage_format.
  If topology_storage_format is set to NNR_TPL_UNREC, definition and identification of the storage format of topology_data is out of scope of this document.
  It is to be noticed that of topology_storage_format is set to NNR_TPL_UNREC, the (header) structure of topology_data could be used to identify the format.
  nnr_rep_type specifies whether pruning information is represented as a bitmask or as a dictionary of references of topology elements.

TABLE 10

Pruning information representation types

| nnr_rep_type value | Identifier | Description |
| --- | --- | --- |
| 0x00 | NNR_TPL_BMSK | Topology related information signaled as bitmask |
| 0x01 | NNR_TPL_DICT | Topology related information signaled as dictionary of topology elements |
| 0x02-0x03 | | Reserved | prune_flag when set to 1 indicates that pruning step is used during parameter reduction and pruning related topology information is present in the payload.
  order_flag when set to 1 indicates that the bitmask should be processed row-major order; and column-major otherwise.
  sparse_flag when set to 1 indicates that sparsification step is used during parameter reduction and related topology information is present in the payload.
  count_ids specifies the number of element ids that are updated.
  element_id specifies the unique id that is used to reference a topology element
  count_dims specifies the number of dimensions
  dim: specifies array of dimensions that contain the new dimensions for the specified element
  bit_mask_value when set to 1 indicates that this specific neuron's weight is pruned if pruning_flag is set to 1 or is sparsified (the weight value is 0) if sparse_flag is set to 1.
  count_bits specifies the number of bits present in the bit mask information.

NNR Quantization Unit Payload Semantics
  quantization_data is a byte sequence of length determined by the NNR unit size describing the neural network quantization information, in the format specified by quantization_storage_format.
  If quantization_storage_format is set to NNR_TPL_UNREC, definition and identification of the storage format of quantization_data is out of scope of this document. It is to be noticed that if quantization_storage_format is set to NNR_TPL_UNREC, the (header) structure of quantization_data could be used to identify the format.
NNR Compressed Data Unit Payload Semantics
  raw_float32_parameter is a float parameter tensor.
NNR Aggregate Unit Payload Semantics
  carries multiple units. NNR aggregate unit payload NNR num_of_nnr_units_minus2+2 parameter in NNR aggregate unit header shall specify how many NNR units are present in the NNR aggregate unit's payload. topology_tensor_dimension_mapping( ) is defined as follows:

| | Descriptor |
| --- | --- |
| topology_tensor_dimension_mapping( ){ | |
| concatenation_axis_index | u(8) |
| for(j=0; j<count_topology_elements_minus2+1;j++) | |
| split_index[j] | ue(7) |
| } | |

In some cases the shapes of tensors may vary in multiple axes. For example, according to the NNEF definition of AlexNet kernel7 [4096, 4096, 1, 1] and kernel8 [1000, 4096, 1, 1] can be concatenated around the axis 0 and the resulting tensor [5096, 4096, 1, 1] can be compressed using NNR. However, kernel3 [384, 192, 3, 3], kernel4 [384, 384, 3, 3] and kernel5 [256, 384, 3, 3] cannot be concatenated since the dimension values differ in more than one axis. This could result in a less optimal compression since the entropy codec component of the NNR codec needs to reset its internal context for each input tensor and concatenation is not possible when multiple axis are different without first manipulating the tensors. However, if the axis could be rearranged, it could be possible to concatenate the above-mentioned tensors and better compression could be achieved.
  The present embodiments provide a method for signalling swapping of multiple axes of tensors in order to enable concatenation around a selected axis. In addition, the present embodiments provide a high-level syntax element which signals "axis swapping" so that tensor dimension can be aligned to enable concatenation for efficient NNR-encoding.
  The method is clarified with a simple example, where kernel3 [384, 192, 3, 3], kernel4 [384, 384, 3, 3] and kernel5 [256, 384, 3, 3] can be concatenated if kernel3's 0th and 1st axis are swapped. Thus kernel3's [384, 192, 3, 3] swapped representation is kernel3'[192, 384, 3, 3]. Following to this, kernel3'[192, 384, 3, 3], kernel4 [384, 384, 3, 3] and kernel5 [256, 384, 3, 3] can be concatenated around the 0th axis. The resulting tensor has dimensions [832, 384, 3, 3] and can be NNR-encoded as a single tensor.
  Furthermore, if the difference between the two or more tensors is the number of axes, such as the tensors [384, 192, 3, 3] and [384, 192, 3, 3, 1000], one or more tensors may first be manipulated by flattening two or more axes, and then the manipulated tensors can be concatenated. For the given example tensors, the tensor of shape [384, 192, 3, 3, 1000] can be manipulated by flattening the last two axes as follows: [384, 192, 3, 3000]. Then, the two tensors can be concatenated around the 3rd axis (using an indexing starting from 0), thus obtaining a concatenated tensor of shape [768, 384, 3, 3003]. In this case, the encoder needs to signal to the decoder that flattening operation was performed, the tensor on which the flattening was performed, and which axes were flattened.

In the following description, details of the present embodiments are clarified by means of examples. It is to be noticed that in the given examples and options below, the data structures may be present in payload or header of relevant NNR units or alike bitstream syntax structures. Moreover, the data types listed in the Descriptor field are given as examples. The syntax element names are also given as examples.

The encoding process of two or more tensors into a single tensor may comprise the following according to an example embodiment:

- process the tensors so that they end up having the same number of dimensions. The processing may comprises combining or flattening dimensions of a tensor;
- identify which axis of each individual tensor can be swapped so that the tensors can be concatenated around a particular axis;
- reshape the tensors so that the dimensions are modified based on the swapped axis;
- concatenate the tensors around the identified axis of concatenation;
- compress the concatenated tensor;
- generate related high-level syntax structures in order to signal the concatenation and axis swapping information;
- generate a final bitstream by combining the high-level syntax information and the compressed tensor.

The corresponding decoding method, according to an example embodiment, can comprise the following. The decoding method is executed on a bitstream containing a compressed tensor's bitstream:

- process the bitstream and identify from high-level syntax elements and/or topology information that the bitstream contains a concatenated tensor;
- identify from the high-level syntax information that the bitstream contains a concatenated and compressed tensor;
- identify the dimensions of the individual tensors that make up the concatenated tensor;
- identify if axis swapping is applied;
- decompress the tensor into a single decompressed tensor;
- split the tensor into individual tensors based on the dimensions of the tensors;
- swap the axis of the individual tensors based on the axis swapping information obtained from the bitstream;
- decompose or reshape the individual tensors so that their final dimensions match with the initial dimension of the individual tensors.

The following high-level syntax structures are examples which represent how the required parameters can be communicated inside the compressed neural network bitstream.

According to first option, swapped dimension indexes per topology element is signaled inside the topology_tensor_dimension_mapping( ) syntax element, which is present in the NNR compressed data unit header. The syntax elements that are written in cursive in the existing topology_tensor_dimension_mapping( ) syntax element in MPEG NNR high level syntax (HLS) shown below, are introduced for the purposes of the present embodiments.

In all the example syntax elements below, N may represent any positive integer. In the text below, the terms axis swapping and axis switching may be used interchangeably.

| | Descriptor |
|---|---|
| topology_tensor_dimension_mapping ( ) { | |
|   concatentation_axis_index | u(8) |
|   for(j = 0; j < count_topology_elements_minus2 + 1 ; j++ ) | |
|     split_index[j] | ue(7) |
|   for(j = 0; j < count_topology_elements_minus2 + 2 ; j++) | |
|     for(i= 0; i < count_tensor_dimensions ; i++) | |
|       dimension_index[j][i] | ue(7) or |
| } | ue(N) | count_topology_elements_minus2+2 specifies the number of topology elements for which this NNR compressed data unit carries data in the payload, as defined in the MPEG NNR specification.

count_tensor_dimensions specifies a counter of how many dimensions are specified. For example, for a 4-dimensional tensor, count_tensor_dimensions is 4. This definition comes from MPEG NNR specification as well.

dimension_index may specify the new dimension index of the j-indexed topology element original tensor's ith dimension. It may be 0-based or 1-based indexing. For example, if the dimension index is 0-based, and if dimensions of the tensor is [3,4,5], and dimension_index[ ] values are {1, 2, 0}, then the dimensions of the new tensor becomes [5, 3, 4].

According to a second option, dimension index swapping difference per topology element is signaled inside the topology_tensor_dimension_mapping( ) syntax element. The syntax elements that are written in cursive in the existing topology_tensor_dimension_mapping( ) syntax element in MPEG NNR high level syntax (HLS) shown below, are introduced for the purposes of the present embodiments.

| | Descriptor |
|---|---|
| topology_tensor_dimension_mapping ( ) { | |
|   ..... | ... |
|   for(j = 0; j < count_topology_elements_minus2 + 2 ; j++) | |
|     for(i = 1; i < count_tensor_dimensions ; i++) | |
|       dimension_swap_delta[j][i] | ue(1) or |
| } | ue(N) |

In addition to the syntax elements in the first option, dimension_swap_delta may indicate how many index values a particular dimension index is shifted to the left. The value of 'i' starts from 1 because the first index shall not be processed since the indices are shifted to the left.

The axis swapping algorithm and method can be described as follows:

Given a list of dimension_swap_delta[i][j] values for a tensor[j], the following is performed until all dimensions have been processed:

1. for each topology element indexed by j, do the following:
   a. for each index value i, do the following:
      1. shift the dimension index value i to the left by the value of dimension_swap_delta[i][j]

This is clarified with the following example:

Change (64, 3, 4, 128) to (128, 3, 64, 4) results in dimension_swap_delta[j][i=1, 2, 3, 4]={0, 1, 0, 3}:

Step 1: (64, 3, 4, 128)→(64, 3, 4, 128)={0, 1, 0, 3}
Step 2: (64, 3, 4, 128)→(3, 64, 4, 128)={0, 1, 0, 3}
Step 3: (3, 64, 4, 128)→(3, 64, 4, 128)={0, 1, 0, 3}
Step 4: (3, 64, 4, 128)→(128, 3, 64, 4)={0, 1, 0, 3}

In the above example, bold values are swapped to the left n number of times. In some example embodiments, the shift may occur to the right of the dimension index.

According to a third option, only the non-zero indexes of the second option are indicated inside the topology_tensor_dimension_mapping( ) syntax element. The syntax elements that are written in cursive in the existing topology_tensor_dimension_mapping( ) syntax element in MPEG NNR high level syntax (HLS) shown below, are introduced for the purposes of the present embodiments.

|  | Descriptor |
|---|---|
| topology_tensor_dimension_mapping ( ) { | |
| .... | ... |
| for(j = 0; j < count_topology_elements_minus2 + 2 ; j++) | |
| cumulative_index = 0 | |
| for(i = 0; i < number_of_shifts ; i++){ | |
| index_delta_minus1[j][i] | ue(1) or |
| cumulative_index +=(index_delta_minus1 + 1) | ue(N) |
| shift_value[j][i] | ue(1) or |
| } | ue(N) |
| } | | cumulative_index indicates the axis index on which a left-shifting of amount shift_value[j][i] is applied.

index_delta_minus1[j][i] indicates the amount of index delta to be incremented on top of existing cumulative_index value.

shift_value[j][i] indicates the amount of left-shift to be performed on the axis with index value cumulative_index.

Shift value applies to the index indicated by cumulative_index

As an example: change (64, 3, 4, 128) to (128, 3, 64, 4)

The procedure according to the second option would require dimension_swap_delta[j][i=1, 2, 3, 4] to be {0, 1, 0, 3}.

number_of_shift would be 2, {Index_delta_minus1, shift_ value} pairs would be {(0, 1) and (1, 3)}

Algorithm and method for applying the axis will be as follows:

1. set cumulative_index to 0;
2. for each shift entry, do the following:
   a) Increment cumulative_index by index_delta_minus1+1 value
   b) Shift the axis with index cumulative_index to the left by shift_value The advantage of the third option compared to the second option is that zero entries will be less, and the data structure can be more compact due to the indexing operation.

According to another embodiment, left shifting may be replaced with right shifting.

A fourth option is a simplified version of the third option. The syntax elements that are written in cursive in the existing topology_tensor_dimension_mapping( ) syntax element in MPEG NNR high level syntax (HLS) shown below, are introduced for the purposes of the present embodiments.

|  | Descriptor |
|---|---|
| topology_tensor_dimension_mapping ( ) { | |
| .... | ... |
| for(j = 0; j < count_topology_elements_minus2 + 2 ; j++) | |
| for(i = 0; i < number_of_shifts ; i++){ | |
| index [j][i] | ue(7) or |
|  | ue(N) |
| shift_value[j][i] | ue(1) or |
|  | ue(N) |
| } | |
| } | | index[j][i] indicates the axis index to be left-shifted.
shift_value[j][i] indicates the amount of left-shift on the axis with index index[j][i].

This option is simpler than the third option, however, more entries may be needed and index[i] [j] may have bigger values then index_delta_minus1.

According to an embodiment, on an encoder side, axis-swapping is done before tensor concatenation.

According to an embodiment, on a decoder side, axis back-swapping may happen after the NNR entropy decoding operations and after tensor splitting operations.

According to an embodiment, axis swapping syntax element may be present in NNR payload as a payload data element instead of NNR unit header.

In order to make the decision on which tensors to choose, the following can be done:

group any tensors that have same number of dimensions, but where only one dimension axis is not compatible with its corresponding axis in other tensor(s);

group any tensors that could have multiple permutated but compatible axis using a sequential approach where each tow tensors are axis swapped and combined;

decide to combine the tensors by predicting the gain from the combination; if the tensors to be combined provide enough gain, conduct the necessary tensor axis swapping and combination. This may require a two-pass process in which the interim output form the first pass (using combined combinations) values are compared and then in the second pass, the actual concatenation and coding is performed. "Gain" refers to the gain in rate-distortion sense, i.e., an improvement in the rate-distortion Lagrangian function F=distortion+lambda*rate, where distortion is a measure of the error between the uncompressed neural network and the decompressed neural network, lambda is the Lagrange multiplier which may be choses arbitrarily or via a learning process. Therefore, a gain may be computed as a difference between the value F when the axis swapping and concatenation method is not used, and the value of F when the axis sapping and concatenation method is used. A positive value for the gain would indicate that the proposed method is beneficial and therefore it may be used for the final encoding of the neural network;

predict the goodness of a merge based on patterns in the filters, e.g. the cross-correlation between filters are calculated to determine how well they may be similar and based on the similarity, the two tensors are merged;

In one case, a separate neural network or other machine learning algorithm (Support Vector Regression (SVR), linear regression, etc.) may be used for regressing the correlation level between two or more tensors on which the proposed method can be applied. If the regressed correlation level is above a predetermined threshold, the proposed method is applied to the two or more tensors.

In another case, a separate neural network or other machine learning algorithm (Support Vector Machine (SVM), logistic regression, etc.) may be used for classifying whether two or more tensors, on which the proposed method could be applied, have enough similarities or correlation, or anyway whether applying the proposed method would be beneficial (i.e., provide gains in the sense of rate-distortion).

In an additional embodiment, if the difference between the two or more tensors is the number of axes, such as the tensors [384, 192, 3, 3] and [384, 192, 3, 3, 1000], one or more tensors may first be manipulated by flattening two or more axes, and then the manipulated tensors can be concatenated. For the previous two example tensors, the tensor of shape [384, 192, 3, 2, 1000] can be manipulated by flattening the two last axes as follows: [384, 192, 3, 3000]. Then the two tensors can be concatenated around the third axes, thus obtaining a concatenated tensor of shape [768, 384, 3, 3003]. In this case, the encoder needs to signal to the decoder that flattening operation was performed, the tensors on which the flattening was performed, and which axes were flattened.

Figure 5:
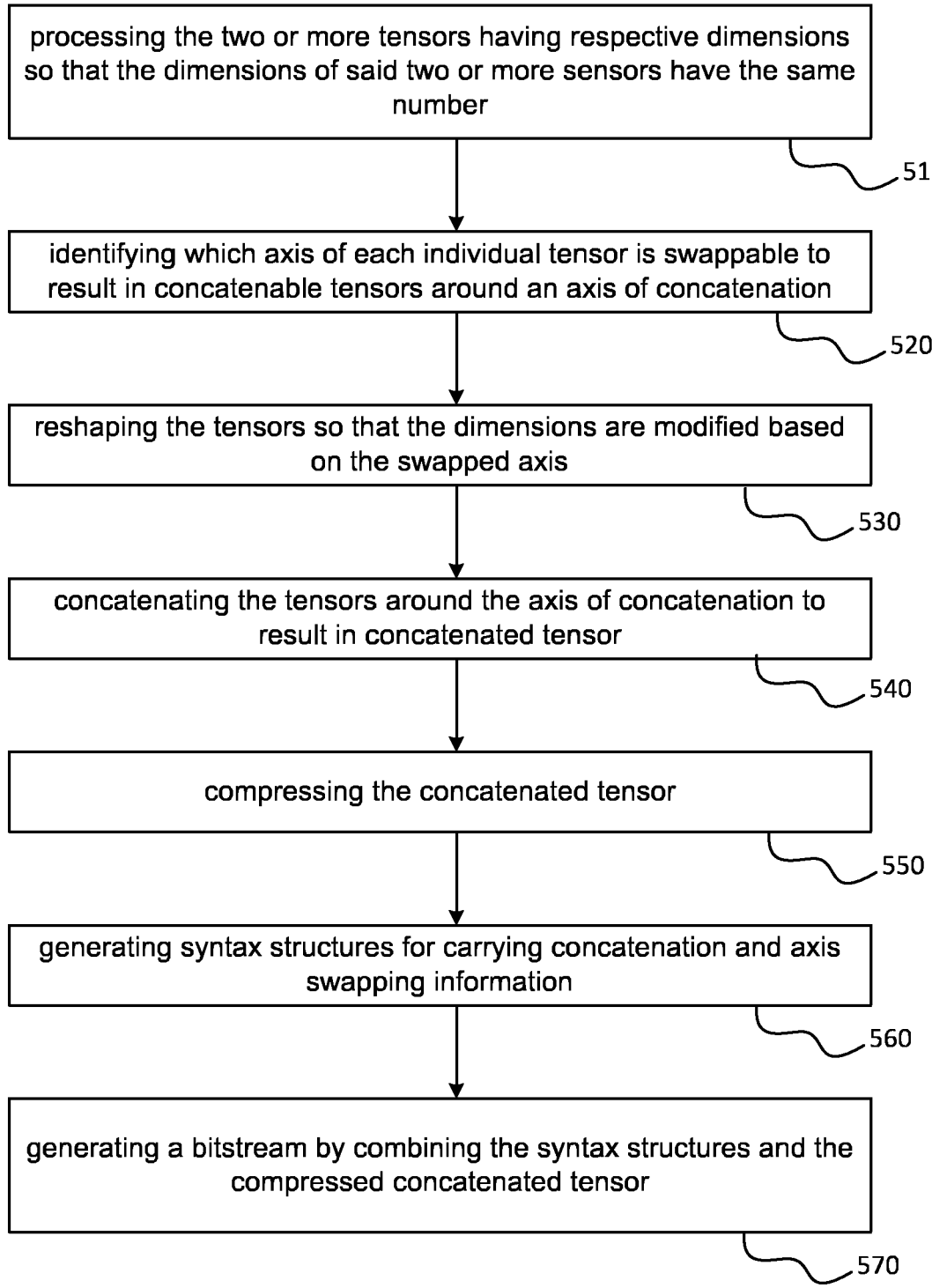
FIG. 5 is a flowchart illustrating a method according to an embodiment.

The method for encoding according to an embodiment is shown in FIG. 5. The method for encoding two or more tensors generally comprises processing 510 the two or more tensors having respective dimensions so that the dimensions of said two or more sensors have the same number; identifying 520 which axis of each individual tensor is swappable to result in concatenable tensors around an axis of concatenation; reshaping 530 the tensors so that the dimensions are modified based on the swapped axis; concatenating 540 the tensors around the axis of concatenation to result in concatenated tensor; compressing 550 the concatenated tensor; generating 560 syntax structures for carrying concatenation and axis swapping information; and generating 570 a bitstream by combining the syntax structures and the compressed concatenated tensor. Each of the steps can be implemented by a respective module of a computer system.

An apparatus for encoding two or more tensors generally comprises means for processing the two or more tensors having respective dimensions so that the dimensions of said two or more sensors have the same number; means for identifying which axis of each individual tensor is swappable to result in concatenable tensors around an axis of concatenation; means for reshaping the tensors so that the dimensions are modified based on the swapped axis; means for concatenating the tensors around the axis of concatenation to result in concatenated tensor; means for compressing the concatenated tensor; means for generating syntax structures for carrying concatenation and axis swapping information; and means for generating a bitstream by combining the syntax structures and the compressed concatenated tensor. The means comprises at least one processor, and a memory including a computer program code, wherein the processor may further comprise processor circuitry. The memory and the computer program code are configured to, with the at least one processor, cause the apparatus to perform the method of FIG. 5 according to various embodiments.

Figure 6:
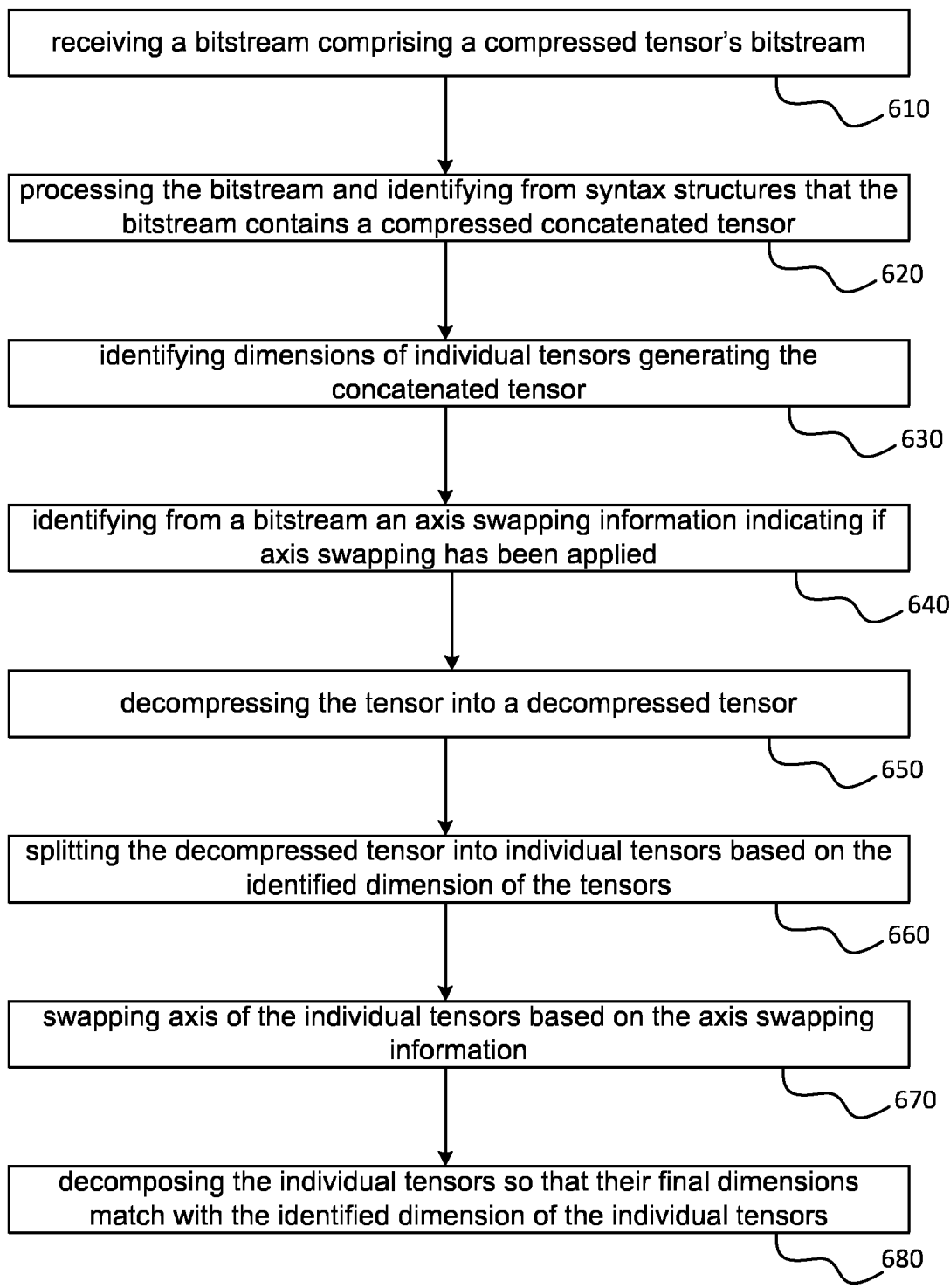
FIG. 6 is a flowchart illustrating a method according to another embodiment.

The method for decoding according to an embodiment is shown in FIG. 6. The method comprises receiving 610 a bitstream comprising a compressed tensor's bitstream; processing 620 the bitstream and identifying from syntax structures that the bitstream contains a compressed concatenated tensor; identifying 630 dimensions of individual tensors generating the concatenated tensor; identifying 640 from a bitstream an axis swapping information indicating if axis swapping has been applied; decompressing 650 the tensor into a decompressed tensor; splitting 660 the decompressed tensor into individual tensors based on the identified dimension of the tensors; swapping 670 axis of the individual tensors based on the axis swapping information; and decomposing 680 the individual tensors so that their final dimensions match with the identified dimension of the individual tensors. Each of the steps can be implemented by a respective module of a computer system.

An apparatus according to an embodiment comprises means for receiving a bitstream comprising a compressed tensor's bitstream; means for processing the bitstream and identifying from syntax structures that the bitstream contains a compressed concatenated tensor; means for identifying dimensions of individual tensors generating the concatenated tensor; means for identifying from a bitstream an axis swapping information indicating if axis swapping has been applied; means for decompressing the tensor into a decompressed tensor; means for splitting the decompressed tensor into individual tensors based on the identified dimension of the tensors; means for swapping axis of the individual tensors based on the axis swapping information; and means for decomposing the individual tensors so that their final dimensions match with the identified dimension of the individual tensors. The means comprises at least one processor, and a memory including a computer program code, wherein the processor may further comprise processor circuitry. The memory and the computer program code are configured to, with the at least one processor, cause the apparatus to perform the method of FIG. 6 according to various embodiments.

Figure 7:
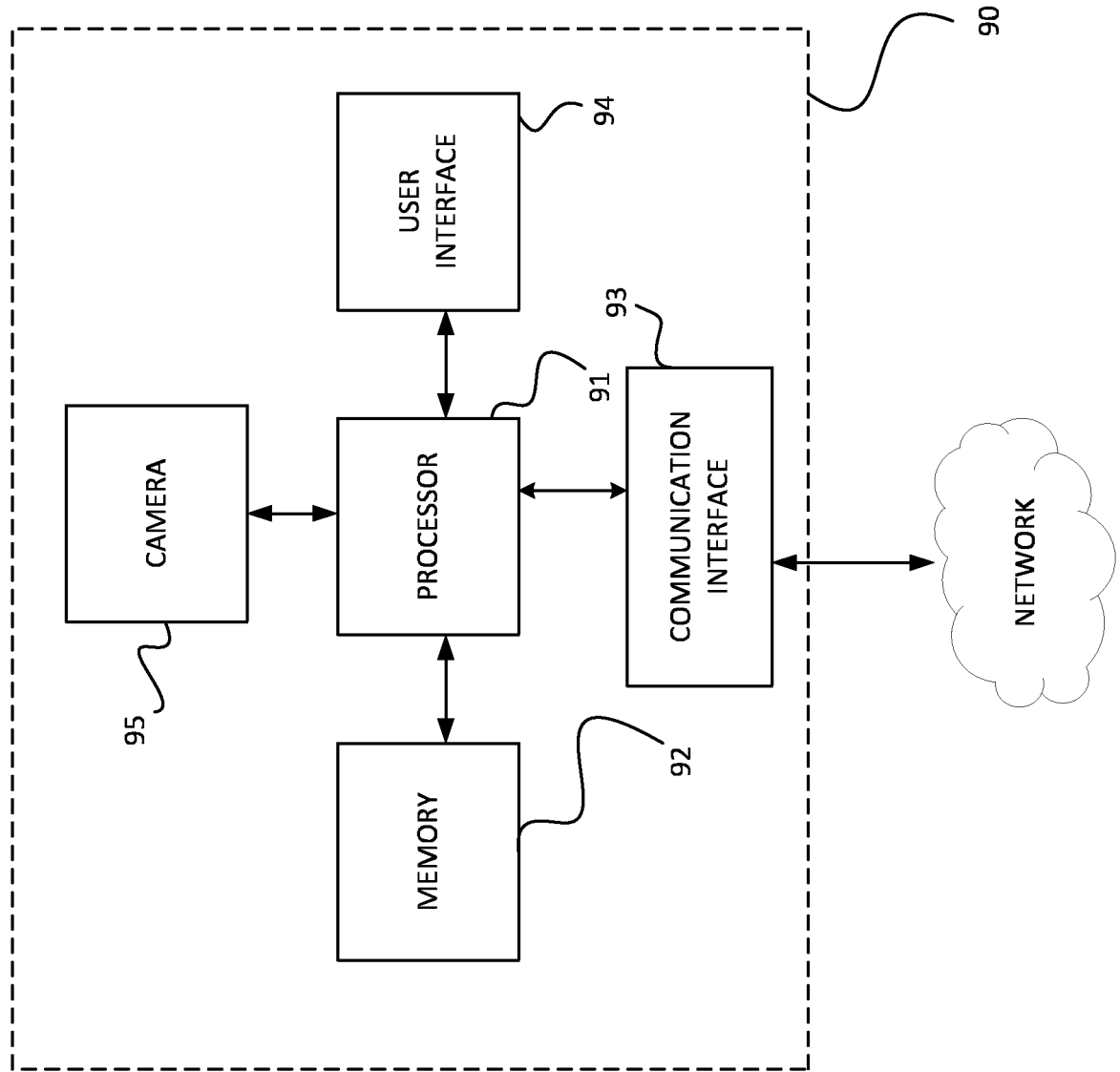
FIG. 7 shows an example of an apparatus.

An apparatus according to an embodiment is illustrated in FIG. 7. The apparatus is a user equipment for the purposes of the present embodiments. The apparatus 90 comprises a main processing unit 91, a memory 92, a user interface 94, a communication interface 93. The apparatus according to an embodiment, shown in FIG. 7, may also comprise a camera module 95. Alternatively, the apparatus may be configured to receive image and/or video data from an external camera device over a communication network. The memory 92 stores data including computer program code in the apparatus 90. The computer program code is configured to implement the method according various embodiments by means of various computer modules. The camera module 95 or the communication interface 93 receives data, in the form of images or video stream, to be processed by the processor 91. The communication interface 93 forwards processed data, i.e. the image file, for example to a display of another device, such a virtual reality headset. When the apparatus 90 is a video source comprising the camera module 95, user inputs may be received from the user interface.

The various embodiments may provide advantages. For example, tensor axis swapping enables more topology elements to be grouped and concatenated together for more efficient NNR-encoding and transmission. In addition, the present embodiments cause less NNR bitstream signalling overhead.

The various embodiments can be implemented with the help of computer program code that resides in a memory and causes the relevant apparatuses to carry out the method. For example, a device may comprise circuitry and electronics for handling, receiving and transmitting data, computer program code in a memory, and a processor that, when running the computer program code, causes the device to carry out the features of an embodiment. Yet further, a network device like a server may comprise circuitry and electronics for handling, receiving and transmitting data, computer program code in a memory, and a processor that, when running the computer program code, causes the network device to carry out the features of an embodiment.

A computer program product according to an embodiment can be embodied on a non-transitory computer readable medium. According to another embodiment, the computer program product can be downloaded over a network in a data packet.

If desired, the different functions discussed herein may be performed in a different order and/or concurrently with other. Furthermore, if desired, one or more of the above-described functions and embodiments may be optional or may be combined.

Although various aspects of the embodiments are set out in the independent claims, other aspects comprise other combinations of features from the described embodiments and/or the dependent claims with the features of the independent claims, and not solely the combinations explicitly set out in the claims.

It is also noted herein that while the above describes example embodiments, these descriptions should not be viewed in a limiting sense. Rather, there are several variations and modifications, which may be made without departing from the scope of the present disclosure as, defined in the appended claims.

The invention claimed is:

1. An apparatus for encoding two or more tensors, the apparatus comprising at least one processor, memory including computer program code, the memory and the computer program code configured to, with the at least one processor, cause the apparatus to perform at least the following:
processing the two or more tensors having respective dimensions so that the dimensions of said two or more tensors have the same number;
identifying which axis of each individual tensor is swappable to result in concatenable tensors around an axis of concatenation;
reshaping the tensors so that the dimensions are modified based on the swapped axis;
concatenating the tensors around the axis of concatenation to result in a concatenated tensor;
compressing the concatenated tensor;
generating syntax structures for carrying concatenation and axis swapping information; and
generating a bitstream by combining the syntax structures and the compressed concatenated tensor.

2. The apparatus according to claim 1, wherein the apparatus is further configured to perform combining or flattening dimensions of a tensor so that said two or more tensors have the same number of dimensions.

3. The apparatus according to claim 1, wherein the bitstream is a compressed neural network bitstream.

4. The apparatus according to claim 1, wherein the apparatus is further caused to perform: signaling swapped dimension indexes in a syntax element present in a compressed data unit header.

5. The apparatus according to claim 1, wherein the apparatus is further caused to perform: signaling a dimension index swapping difference in a syntax element present in a compressed data unit header.

6. The apparatus according to claim 5, wherein the dimension index swapping difference comprises non-zero indexes.

7. An apparatus for decoding, the apparatus comprising at least one processor, memory including computer program code, the memory and the computer program code configured to, with the at least one processor, cause the apparatus to perform at least the following:
receiving a bitstream comprising a bitstream of a compressed tensor;
processing the bitstream and identify from syntax structures that the bitstream comprises a compressed concatenated tensor;
identifying dimensions of individual tensors generating the concatenated tensor;
identifying from the bitstream an axis swapping information indicating whether axis swapping has been applied;
decompressing the tensor into a decompressed tensor;
splitting the decompressed tensor into individual tensors based on the identified dimensions of the individual tensors;
swapping axis of the individual tensors based on the axis swapping information; and
decomposing the individual tensors so that their final dimensions match with the identified dimensions of the individual tensors.

8. The apparatus according to claim 7, wherein the bitstream is a compressed neural network bitstream.

9. The apparatus according to claim 7, wherein the apparatus is further caused to perform: determining swapped dimension indexes from a syntax element present in a compressed data unit header.

10. The apparatus according to claim 7, wherein the apparatus is further caused to perform: determining a dimension index swapping difference from a syntax element present in a compressed data unit header.

11. The apparatus according to claim 10, wherein the dimension index swapping difference comprises non-zero indexes.

12. A method, comprising:
processing two or more tensors having respective dimensions so that the dimensions of said two or more tensors have the same number;
identifying which axis of each individual tensor is swappable to result in concatenable tensors around an axis of concatenation;
reshaping the tensors so that the dimensions are modified based on the swapped axis;
concatenating the tensors around the axis of concatenation to result in a concatenated tensor;
compressing the concatenated tensor;
generating syntax structures for carrying concatenation and axis swapping information; and
generating a bitstream by combining the syntax structures and the compressed concatenated tensor.

13. The method according to claim 12, wherein the processing comprises combining or flattening dimensions of a tensor so that said two or more tensors have the same number of dimensions.

14. The method according to claim 12, wherein the bitstream is a compressed neural network bitstream.

15. The method according to claim 12, further comprising: signaling swapped dimension indexes in a syntax element present in a compressed data unit header.

16. The method according to claim 12, further comprising: signaling a dimension index swapping difference in a syntax element present in a compressed data unit header.

17. The method according to claim 16, wherein the dimension index swapping difference comprises non-zero indexes.

18. A method, comprising:
receiving a bitstream comprising a bitstream of a compressed tensor;
processing the bitstream and identifying from syntax structures that the bitstream comprises a compressed concatenated tensor;
identifying dimensions of individual tensors generating the concatenated tensor;
identifying from the bitstream an axis swapping information indicating whether axis swapping has been applied;
decompressing the tensor into a decompressed tensor;
splitting the decompressed tensor into individual tensors based on the identified dimensions of the individual tensors;
swapping axis of the individual tensors based on the axis swapping information; and
decomposing the individual tensors so that their final dimensions match with the identified dimensions of the individual tensors.

19. The method according to claim 18, further comprising: determining swapped dimension indexes from a syntax element present in a compressed data unit header.

20. The method according to claim 18, further comprising: determining a dimension index swapping difference from a syntax element present in a compressed data unit header.

* * * * *